United States Patent
Yamanishi et al.

(10) Patent No.: US 7,525,805 B2
(45) Date of Patent: Apr. 28, 2009

(54) ELECTRONIC APPARATUS

(75) Inventors: Hirokazu Yamanishi, Kawasaki (JP); Shunsuke Sone, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 67 days.

(21) Appl. No.: 11/862,738

(22) Filed: Sep. 27, 2007

(65) Prior Publication Data

US 2008/0130220 A1 Jun. 5, 2008

(30) Foreign Application Priority Data

Dec. 4, 2006 (JP) .............................. 2006-326628

(51) Int. Cl.
H05K 7/20 (2006.01)
H05K 5/00 (2006.01)

(52) U.S. Cl. ........................ 361/730; 361/695; 361/725; 361/727; 361/731

(58) Field of Classification Search ........................ None
See application file for complete search history.

(56) References Cited

U.S. PATENT DOCUMENTS

| | | | | | |
|---|---|---|---|---|---|
| 5,808,876 | A | * | 9/1998 | Mullenbach et al. | 361/788 |
| 6,473,298 | B1 | * | 10/2002 | Ruckman et al. | 361/685 |
| 6,665,179 | B2 | * | 12/2003 | Chou | 391/687 |
| 6,724,635 | B2 | * | 4/2004 | Larson et al. | 361/736 |
| 7,079,381 | B2 | * | 7/2006 | Brehm et al. | 361/685 |
| 7,209,358 | B2 | * | 4/2007 | Garnett et al. | 361/735 |
| 2008/0043427 | A1 | * | 2/2008 | Lee et al. | 361/687 |

FOREIGN PATENT DOCUMENTS

JP  4-223284 A1  8/1992

* cited by examiner

*Primary Examiner*—Boris L Chervinsky
(74) *Attorney, Agent, or Firm*—Westerman, Hattori, Daniels & Adrian, LLP.

(57) ABSTRACT

An electronic apparatus includes a housing, a first unit that is attached through a front side of the housing, a second unit that is attached through a backside of the housing, a panel that has a first surface connected to the first unit, and a second surface connected to the second unit, and establishes an electric connection between the first unit and the second unit, and a support member to which the panel is attached, the support member being movable relative to the housing in a side surface direction of the housing.

9 Claims, 9 Drawing Sheets

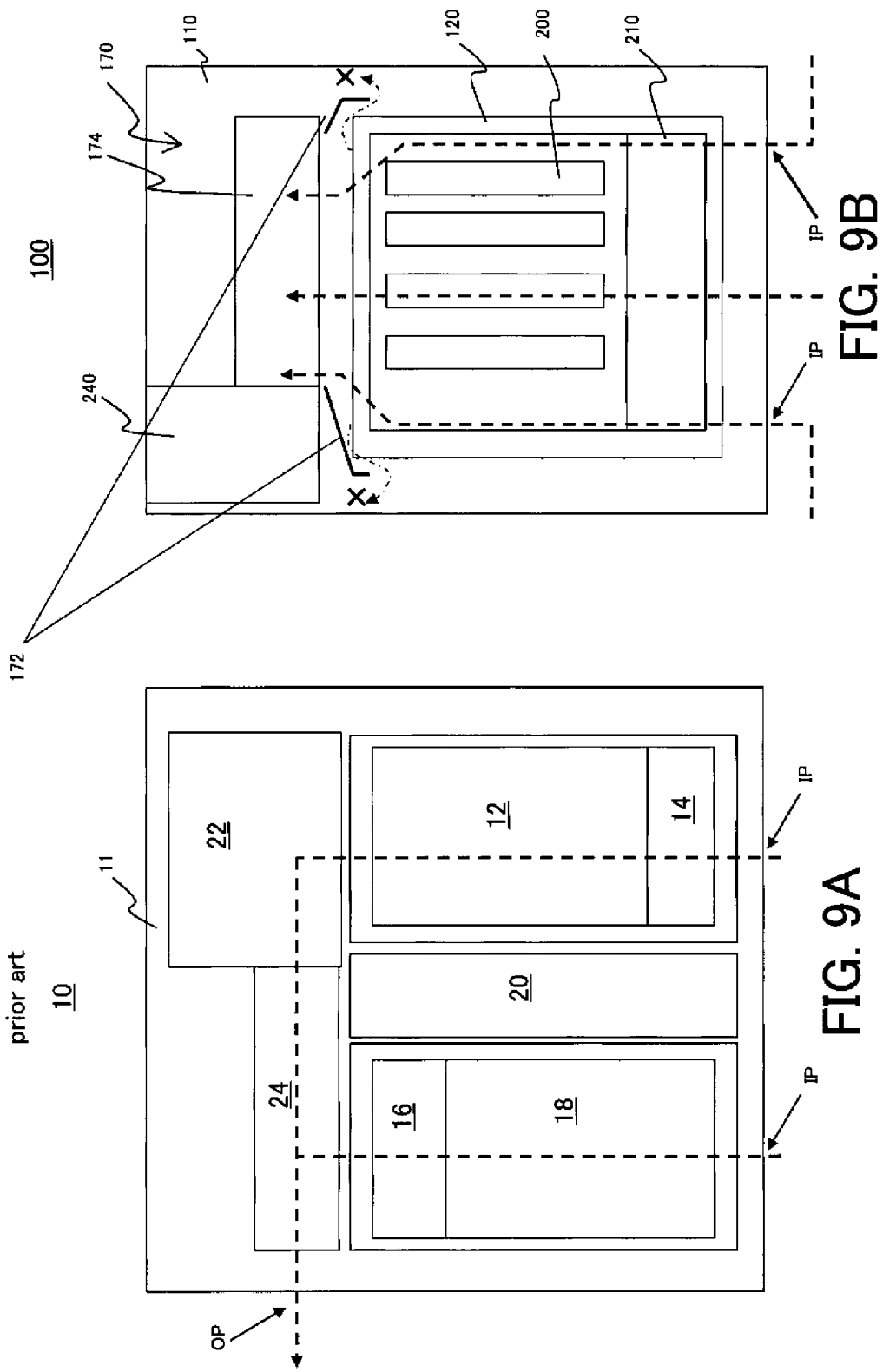

ELECTRONIC APPARATUS

This application claims the right of a foreign priority based on Japanese Patent Application No. 2006-326628, filed on Dec. 4, 2006, which is hereby incorporated by reference herein in its entirety as if fully set forth herein.

BACKGROUND OF THE INVENTION

The present invention relates generally to an electronic apparatus, and more particularly to an electronic apparatus that has a back panel that is engageable with and electrically connected to plural units, and serves as an input/output (I/O) interface for each unit. The present invention is suitable, for example, a housing structure of a large electronic apparatus, such as a server and a central computer in a communication base station.

Along with the recent demands for high performance and large capacity, the server increasingly becomes larger and heavier. On the other hand, the server is required to improve the workability in various processes. There are two types in shipping the server product—shipping the entire server and shipping a single unit in the server, such as a CPU unit and an IO unit. In each pattern, the target apparatus is tested before the product is shipped to guarantee the apparatus performance.

In the latter shipping type, the unit is shipped after the individual performance test. For example, in shipping the back panel, the server is assembled once for an operation/performance test of the back panel. If the test result is successful, the server is disassembled and the back panel is taken out and shipped.

A typical server has connection parts to be connected with plural units, such as a CPU unit and an IO unit, on front and back surfaces of the flat back panel, and various types of units are mounted on both surfaces of the back panel. The server's housing opens on the front and back surfaces, and the units are mounted on the connection parts of both surfaces of the back panel from both open sides of the housing. In order to mount plural units on both sides of the back panel in the housing, the back pane is located at the center in the housing.

Prior art is, for example, Japanese Patent Application, Publication No. 4-223284.

However, the conventional server's housing has a problem of bad workability in various processes, in particular, in the test, exchange, and maintenance of the back panel arranged at the center of the housing. In particular, after the test of the back panel ends, or in the exchange and maintenance of the back panel, it is necessary for a personnel to detach all components, such as a unit and a shelf, from both sides of the back panel and to creep into the housing and to pulls the back pane out of the housing. As the server becomes large, the back panel becomes large and heavy. The maintenance and exchange of the back panel become arduous, and the downtime becomes long. Of course, it is arduous to disassemble the server before and after the back-panel test, and the test time becomes long. Thus, many operations necessary for the test and maintenance makes a test time period long and increases the product manufacturing cost.

BRIEF SUMMARY OF THE INVENTION

The present invention is directed to an electronic apparatus that improves the workability in various processes.

An electronic apparatus according to one aspect of the present invention includes a housing, a first unit that is attached through a front side of the housing, a second unit that is attached through a backside of the housing, a panel that has a first surface connected to the first unit, and a second surface connected to the second unit, and establishes an electric connection between the first unit and the second unit, and a support member to which the panel is attached, the support member being movable relative to the housing in a side surface direction of the housing.

An electronic apparatus according to another aspect of the present invention includes a back panel that is engaged with and electrically connected to plural units, and serves as an interface for the plural units, a housing that accommodates the plural units and the back panel, a first support member that supports the back panel, and a self-propelled first moving unit that moves the first support member relative to the housing and the plural units. This electronic apparatus uses the first support member and the first moving unit to pull the back panel relative to the unit and the housing and exchange the back panel. The term "self-propelled," as used herein, covers a structure that has a working load reducing effect, such as a roller, a bearing, and an electric motor. Only the back panel can be exchanged without disassembling the electronic apparatus unlike the prior art, the workability improves. The electronic apparatus covers a server, a central computer in the base station, and a server tester.

Preferably, the electronic apparatus further includes a positioning mechanism that positions the first support member relative to the housing. Thereby, even when the back panel has been moved, a subsequent alignment and connection between the back panel and each unit becomes easy, improving the workability.

The plural units preferably include a power unit, and a power bar connected to the power unit, the first support member is connected to the power bar, and a connection part between the first support member and the power bar exposes outside the housing. Since the connection part, such as a metal fitting, exposes to the outside of the housing, the connection part can be disconnected from the outside and the first support part can be pulled out without disassembling the electronic apparatus, unlike the prior art. Therefore, the workability improves. The phrase "exposes outside the housing" merely requires a possibility of exposure, and allows the connection part to be covered by a door of the housing, etc.

The plural units preferably include a heat-radiating fan unit, and the back panel has connection parts between an external apparatus and the fan unit, and the connection parts can expose outside the housing. Since the connection part, such as a connector part, exposes to the outside of the housing, the connection part can be disconnected from the outside and the first support part can be pulled out without disassembling the electronic apparatus, unlike the prior art. Therefore, the workability improves. The phrase "can expose outside the housing" merely requires a possibility of exposure, and allows an exposure after slight pulling of the first support member.

An electronic apparatus preferably further includes a second support member that supports the plural units, and a self-propelled second moving unit that moves the second support member relative to the housing and the back panel. This electronic apparatus uses the second support part and the second moving unit to pull the unit relative to the back panel and the housing and exchange the unit, improving the workability. The electronic apparatus preferably further includes a positioning mechanism that positions the second support member relative to the first support member. Thereby, even when the back panel and the unit are moved, a subsequent alignment and connection between the back panel and each unit can be easy, and the workability improves. The electronic apparatus preferably further includes an interlock mechanism that fixes the first support member onto the second support member while the plural units are engaged with the back panel. Thereby, while the unit is engaged with the back panel, the first support member is not erroneously moved and the workability improves. The plural units include a heat-radiating fan unit, the electronic apparatus preferably further including an exhaust flow control plate that is fixed in the housing, and defines an exhaust channel from the fan unit. Thereby, the exhaust efficiency can be maintained.

Other objects and further features of the present invention will become readily apparent from the following description of the preferred embodiments with reference to accompanying drawings.

BRIEF DESCRIPTION OF THE DRAWINGS

FIG. 9A is a sectional view showing a conventional exhaust channel. FIG. 9B is a sectional view showing an exhaust channel in the server shown in FIG. 1A.

DETAILED DESCRIPTION OF THE PREFERRED EMBODIMENTS

Figure 1:
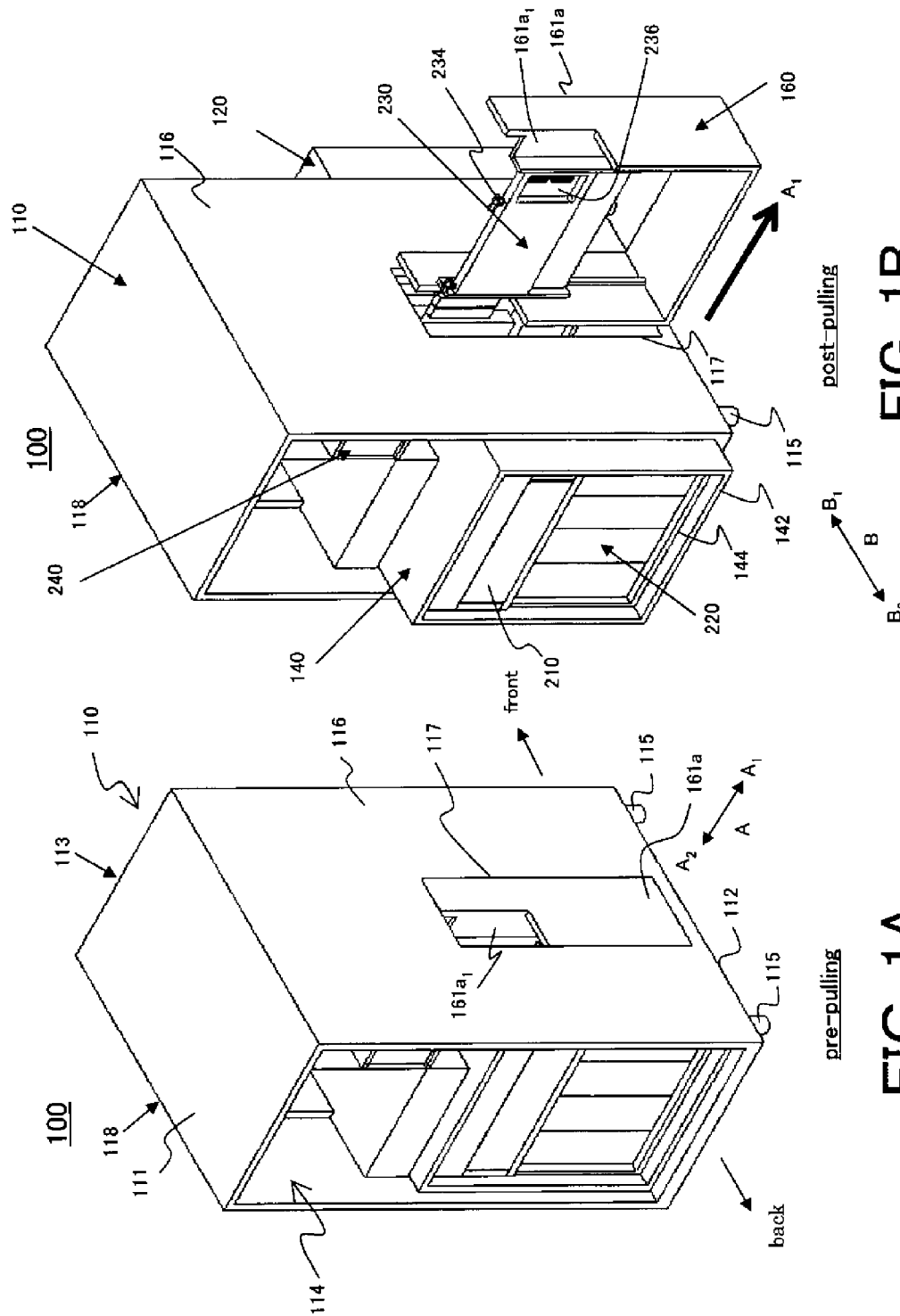
FIG. 1A is a rear perspective view of a server according to one aspect of the present invention before a back panel (BP) movable shelf is pulled out.
FIG. 1B is a rear perspective view of the server after the BP movable shelf is pulled out in FIG. 1A.

Referring now to the accompanying drawings, a description will be given of a server 100 according to one embodiment of the present invention. FIG. 1A is a rear perspective view of the server 100 before the back panel ("BP") movable shelf 160 is pulled out. FIG. 1B is a rear perspective view of the server 100 after the BP movable shelf 160 is pulled out of the housing 110.

Figure 7:
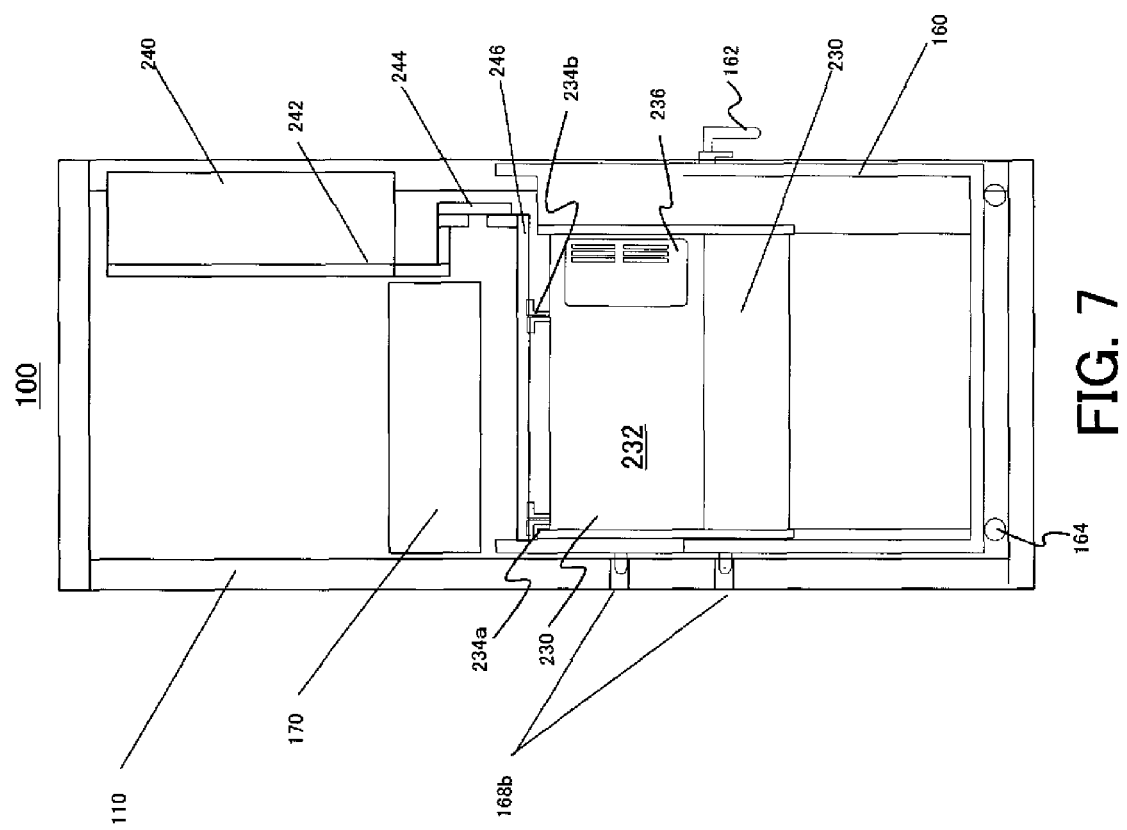
FIG. 7 is a sectional view near the BP movable shelf of the server shown in FIG. 1A.

The server 100 includes various units, a housing 110, an anterior movable shelf 120, a posterior movable shelf 140, a BP movable shelf 160, and an exhaustion mechanism 170 (illustrated in FIG. 7). The anterior movable shelf 120 and the posterior movable shelf 140 are detachably movable from the housing 110 in an arrow B direction shown in FIG. 1B. The BP movable shelf 120 is detachably mounted with the BP 230, and can be pulled out in an arrow $A_1$ direction in FIG. 1B from the side surface of the housing 110. The BP 230 is attached to and detached from the BP movable shelf 120 in a state shown in FIG. 1B in which the BP movable shelf 120 is pulled out from the side surface of the housing 110.

Various units in the server 100 of this embodiment include a CPU unit 200, a fan unit 210, an IO unit 220, a BP 230, and a power unit 240. The CPU unit 200 includes a CPU and executes various operations, and serves as a controller. Four CPU units 200 are provided to the anterior movable shelf 120 in this embodiment. The fan unit 210 is a unit that cools the CPU units 200 and the IO units 220. The IO unit 220 serves as a storage. This embodiment provides four IO units 220 to the posterior movable shelf 140.

Figure 2:
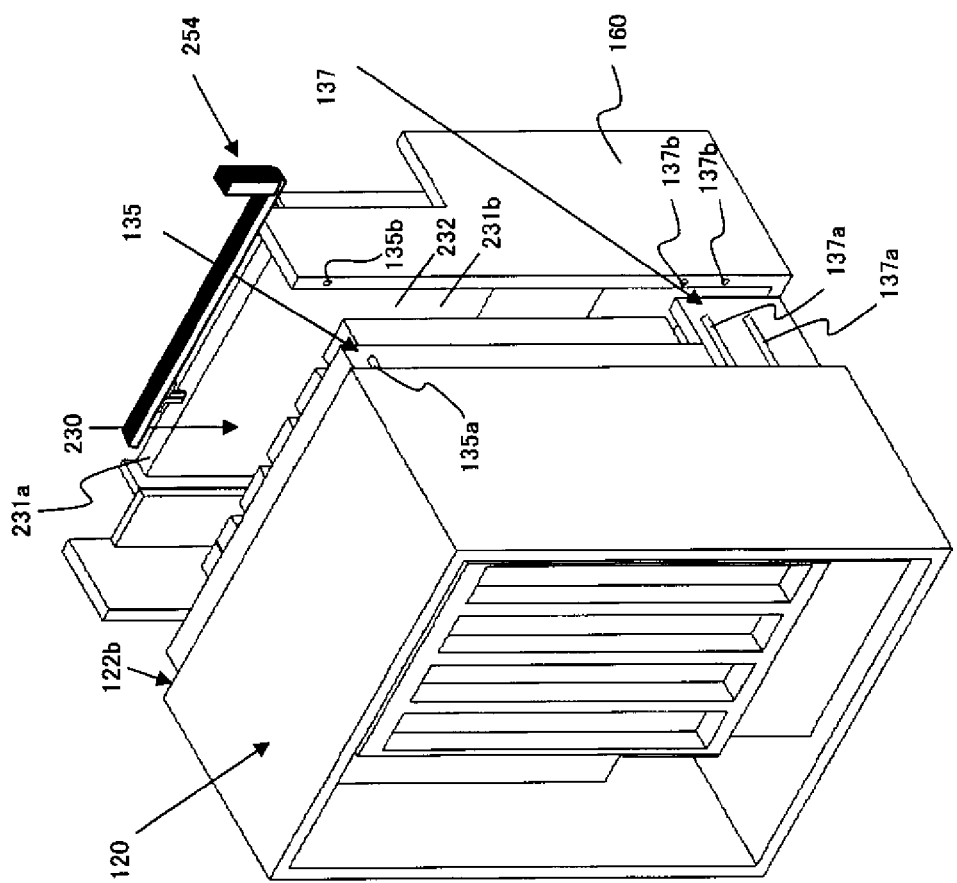
FIG. 2 is an exploded perspective view for explaining an interlock mechanism and a positioning mechanism between an anterior movable shelf and the BP movable shelf of the server shown in FIG. 1A.
Figure 3:
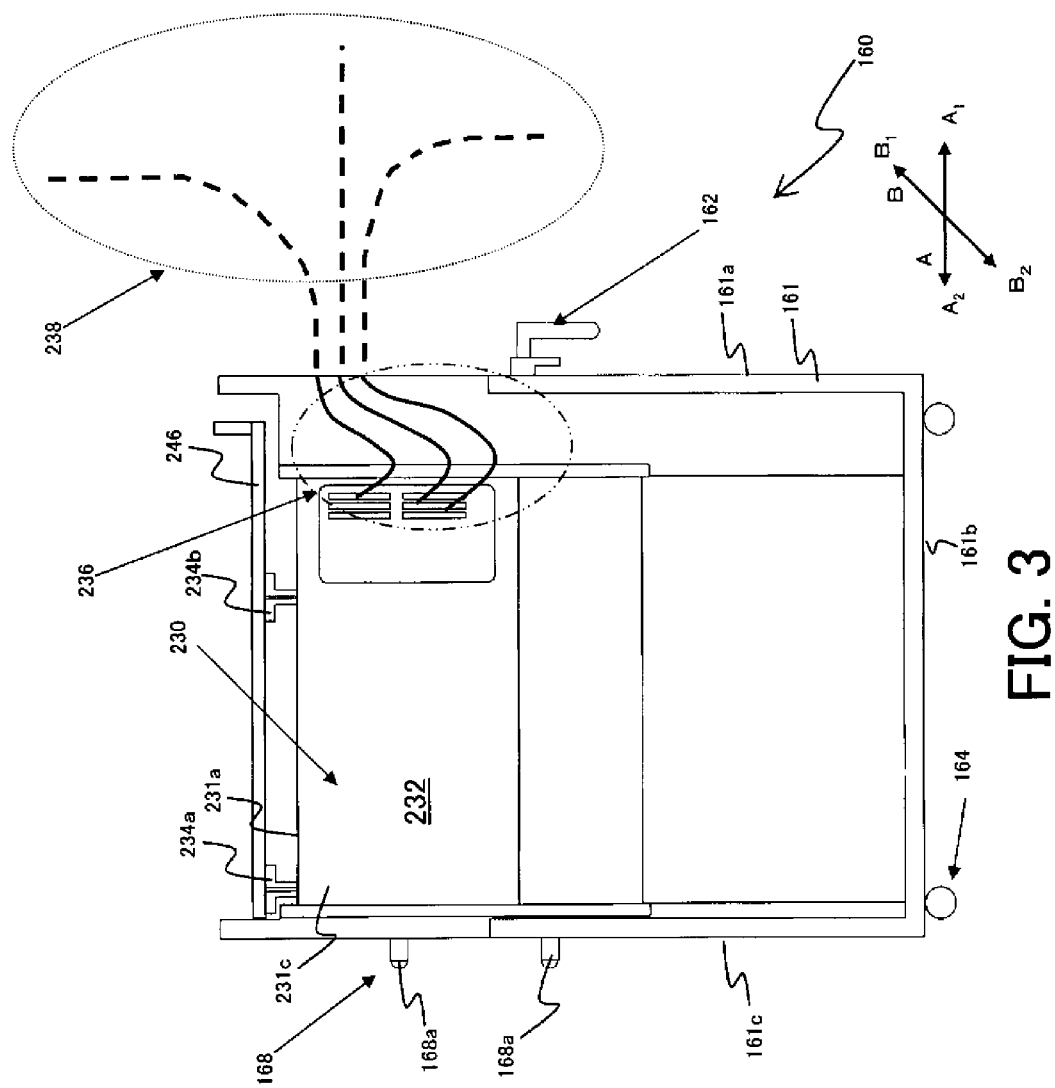
FIG. 3 is a side view of the BP movable shelf of the server shown in FIG. 1B.

The BP 230 has a flat shape, and a top surface 231a, a front surface 231b, and a rear surface 231c, as shown in FIGS. 2, 3 and 7. Here, FIG. 2 is an exploded perspective view for explaining a positioning mechanism 135 and an interlock mechanism 137, which will be described later. FIG. 3 is a schematic side view of the BP movable shelf 160 on the side of the posterior movable shelf 140. FIG. 7 is a schematic sectional view of the server 100.

The BP 230 includes, as shown in FIGS. 2 and 3, a pair of connection parts 232, a connection part 234, and a connector part 236.

The connection parts 232 serve as connectors provided on the front surface 231b and the rear surface 231c of the BP 230. The connection part 232 on the front surface 231b is engaged with and electrically connected to the CPU units 200 in the anterior movable shelf 120. This embodiment provides four connection parts 232 corresponding to the four CPU units 200 on the side of the front surface 231b. The connection part 232 on the side of the rear surface 231c is engaged with and electrically connected to the IO units 220 in the posterior movable shelf 140. This embodiment provides four connection parts 232 corresponding to the four IO units 220 on the side of the rear surface 231c.

The BP 230 supplies the power from the power unit 240 to each unit connected to the BP 230. The BP 230 enables the CPU unit 200 to communicate with the IO unit 220. The BP 230 is connected to and communicates with an external apparatus, such as a tester 290, which will be described later, and enables each unit to communicate with the external apparatus.

The connection part 234 is fixed onto a power bar 246, and supplied with the power from the power unit 240 via the power bar 246. One connection part 234a supplies the power supply to the CPU units 200 connected to the connection part 232 on the side of the front surface 231b of the BP 230, and the other connection part 234b supplies the power supply to the IO units 220 connected to the connection part 232 on the side of the rear surface 231c of the BP 230. Although not shown, the respective connection parts 234a and 234b are connected to power supply wiring in the BP 230.

Figure 4:
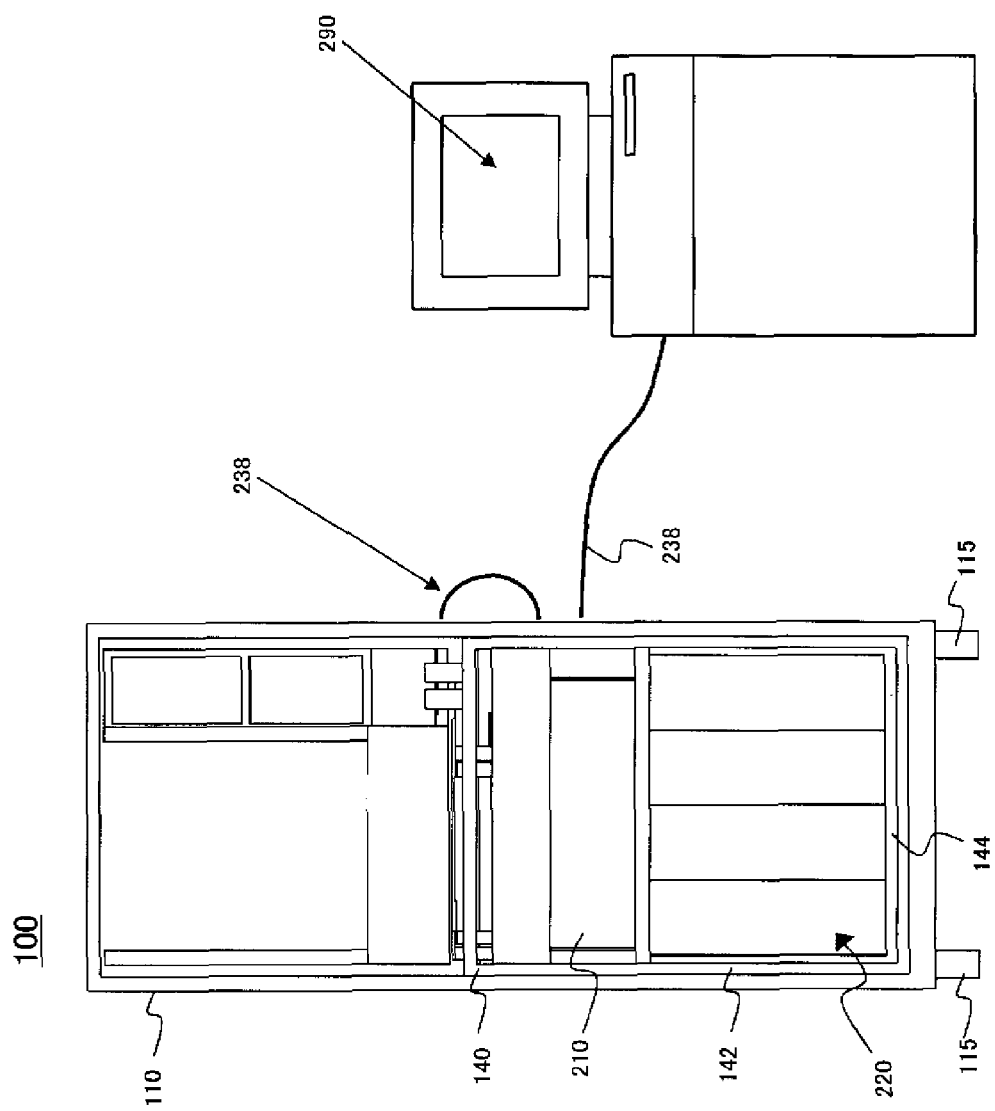
FIG. 4 is a front view of the server shown in FIG. 1A connected to an external tester.

The connector part 236 is provided on the rear surface 231c of the BP 230, and serves as a connection part to be connected to an external apparatus, such as the tester 290 shown in FIG. 4. The connector part 236 can expose to the outside of the housing 110 when the BP movable shelf 160 is pulled out from the housing 110. Cables 238 that extends from the connector part 236 expose to the outside of the housing 110, as shown in FIGS. 3 and 4. Here, FIG. 4 is a rear view of the server 100 connected to the tester 290.

The power unit 240 supplies the power to the BP 230. As shown in FIG. 7, the power unit 240 supplies the power via a pair of power bars 242 and 246, and a power connecting metal fitting 244. The power bar 246 is connected to the connection part 234 of the BP 230. The power bar 242 is connected to the power unit 240. The power bars 242 and 246, and the metal fitting 244 supply the power from the power unit 240 to the BP 230, and screws (not shown) connect the power bar 242 and the metal fitting 244 to each other, and the power bar 246 and the metal fitting 244 to each other. When they are unscrewed, the metal fitting 244 can be detached from the power bars 242 and 246. Thereby, the BP 230 is disconnected from the power unit 240, and the movable shelf 160 can be pulled out in the $A_1$ direction in FIGS. 1A, 1B, and 3.

The housing 110 accommodates such components as each unit and BP 230 in the server 100, and is placed on the floor via the four legs 115 provided at four corners of the bottom surface 112. The housing 110 has a rectangular-parallelepiped shape that has a top surface 111, a bottom surface 112, a front surface 113, a rear surface 114, and a pair of side surfaces 116 and 118.

The four legs 115 are provided at the four corners of the bottom surface 112. The front surface 113 and the rear surface 114 of the housing 110 open. The opening of the front surface 113 is a pulling opening of the anterior movable shelf 120, and the opening of the rear surface 114 is a pulling opening of the posterior movable shelf 140. Of course, for dustproof purposes of the inside of the housing 110, the front surface 113 and the rear surface 114 may be provided with doors, or plates may be provided before the anterior and posterior movable shelves 120 and 140 so that the plates can move with these shelves and fit the front surface 113 and the rear surface 114. A rectangular opening 117 is provided in the right side surface 116 of the housing. The rectangular opening 117 is a pulling opening of the BP movable shelf 160.

The anterior movable shelf 120 includes, as shown in FIG. 5A, a rectangular-parallelepiped outer frame 122, a rectangular-parallelepiped inner frame 124, a moving mechanism 130, a positioning mechanism 135, and an interlock mechanism 137. Here, FIG. 5A is a perspective view of the anterior movable shelf 120. The posterior movable shelf 140 has a structure similar to the anterior movable shelf 120 except for a pulling direction, and a detailed description thereof will be omitted. In other words, the posterior movable shelf 140 includes a rectangular-parallelepiped outer frame 142, a rectangular-parallelepiped inner frame 144, a movement mechanism (not shown), a positioning mechanism (not shown), and an interlock mechanism (not shown).

The outer frame 122 is arranged so that the outer frame 122 can move in the B direction shown in FIGS. 1B and 5A relative to the housing 110. The outer frame 122 serves as a (second) support member that supports and accommodates the inner frame 124 and the fan unit 210. The outer frame 122 opens a front surface 122a and a rear surface 122b. Thus, the outer frame 122 has a bent stripe shape.

The inner frame 124 has plural accommodation parts 125 each of which accommodates the unit 200, and the inner frame 124 can accommodate plural units 200. The inner frame 124 is screwed on the outer frame 122. The number of accommodation parts 125 provided in inner frame 124 is not limited to the embodiment shown in FIG. 5. Each unit 200 is detachably accommodated in the inner frame 124. A pair of levers 126 are provided above and below each accommodation part 125, and the levers 126 lock the unit 200 to and unlocks the unit 200 from the inner frame 124. Each lever 126 is configured movable by 90° between the lock position and the unlock position. The lever 126 located at the lock position locks the unit 200 into the inner frame 124. The lever 126 located at the unlock position unlocks the unit 200 from the inner frame 124.

The moving mechanism 130 of this embodiment has a pair of convexes 132 in a pair of side surfaces 122c and 122d of the outer frame 122. The convex 132 has a constant width and extends in the moving direction B of the outside shelf 122. The bottom surface 132a of the convex 132 is engaged with a convex provided on the inner surface of the side surfaces 116 and 118 of the housing 110. For example, as shown in FIG. 5B, plural rollers 134 provided on the bottom surface 132a of the convex 132 contact and rotate over the top surface $116a_1$ of the convex 116a provided on the inner surface of the side surface 116. Here, FIG. 5B is a schematic sectional view of the illustrative moving mechanism 130.

The moving mechanism (second moving unit) 130 is provided to facilitate the movement of the outer frame 122 relative to the housing 110 and the BP 230 in the B direction. The $B_1$ direction is a pulling direction of the outer frame 122 from the housing 110. Similarly, the $B_2$ direction is an accommodation direction. The moving mechanism 130 can apply any structures known in the art. For example, the moving mechanism 130 may be a caster (self-propelled means) and wheels (not shown) provided on the bottom surface 122e of the outer frame 122.

The positioning mechanism 135 positions the anterior movement frame 120 relative to the BP movable shelf 160, and secures an alignment between the unit 200 and the BP 230. The positioning mechanism 135 includes, as shown in FIG. 2, a pair of positioning pins 135a fixed on the rear surface 122b of the outer frame 122, and a pair of engagement holes 135b that are formed in the BP movable shelf 160 and engageable with the positioning pins 135a.

The interlock mechanism 137 fixes the anterior movement frame 120 onto the BP movable shelf 150 while the unit 200 is connected to the BP 230, prohibiting pulling out of the BP movable shelf 160 from the housing 110. The interlock mechanism 137 includes, as shown in FIG. 2, plural interlock pins 137a fixed onto lower back part of the outer frame 122, and the engagement holes 137b that are formed in the BP movable shelf 160 and engageable with the interlock pins 137a.

When the pulling amount of the anterior and posterior movable shelves 120 and 140 from the housing 110 is insufficient, the connector pins of the units mounted on the movable shelves may not be separated from the connectors of the BP 230. When the BP movable shelf 160 is pulled out of the housing 110 in this state, the connector pin of each unit may get damaged or another failure occurs. In order to prevent this failure, the interlock pin 137a of this embodiment is as long as a stroke necessary to completely disconnect the connector pin 137a of each unit from the connector of the BP 230. Since the interlock pins 137a are engaged with the engagement holes 137b, the BP movable shelf 160 can be prevented from being pulled out until the connector pin of each unit is disconnected from the connector of the BP 230.

The BP movable shelf 160 includes, as shown in FIG. 3, a U-shaped frame 161, a pressurizing mechanism 162, a moving mechanism 164, and a positioning mechanism 168.

The frame 161 is arranged movable relative to the housing 110 in the A direction, and serves as a (first) support member that supports and accommodates the BP 230. The frame 161 detachably supports the BP 230, but the present invention does not limit the supporting manner. In this embodiment, the A direction is orthogonal to the B direction.

The frame 161 has a front surface 161a, a rectangular bottom surface 161b, and an L-shaped rear surface 161c. The front surface 161a has, as shown in FIGS. 1A and 1B, an L shape when viewed from its front surface, and defines a rectangular opening $161a_1$. The metal fitting 244 exposes to the outside of the housing 110 from the opening $161a_1$ in the state shown in FIG. 1A. Therefore, in the state shown in FIG. 1A, the screws that connects the metal fitting 244 to the power bars 242 and 246 can be detached.

The pressurizing mechanism 162 locks the frame 161 to and unlocks the frame 161 from the housing 110. The pressurizing mechanism 162 is also provided on the anterior movement frame 120 and the posterior movement frame 140, but not shown. On the anterior frame movement frame 120 and the posterior movement frame 140, the pressurizing mechanism locks the outer frames 122 and 142 to and unlocks the outer frames 122 and 142 from the housing 110.

Figure 6:
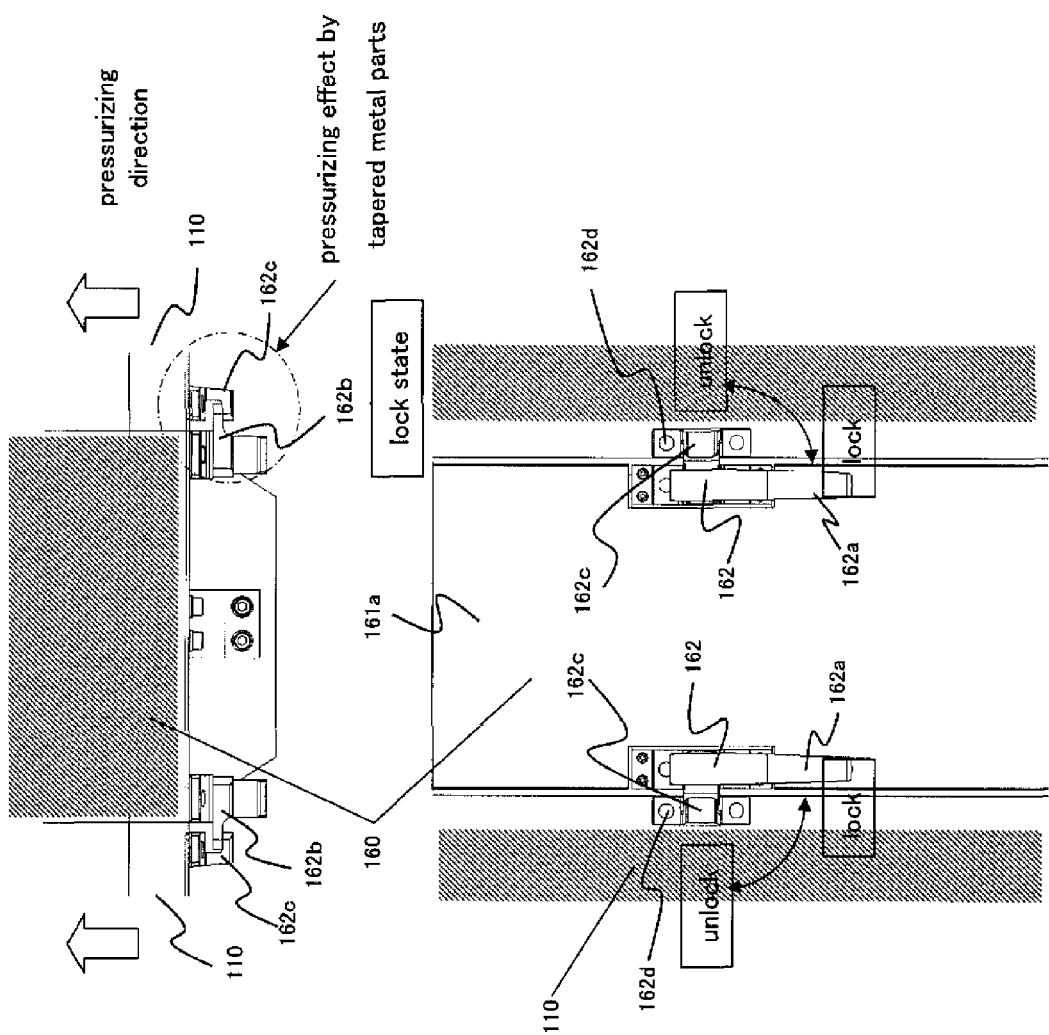
FIG. 6 is a view for explaining a pressurizing mechanism of the BP movable shelf shown in FIG. 4.

The pressurizing mechanism 162 has, as shown in FIG. 6 that is a view of the BP movable shelf 160 fixed onto the housing 110 from the top and front surfaces, a handle 162a, a tab 162c, and a fixed part 162d. The handle 162a has an engagement part 162b as a tapered part that is engageable with the tab 162c and inclines and extends in a direction orthogonal to the longitudinal direction of the handle 162a. A pair of handles 162a are provided on the front surface 161a of the BP movable shelf 160, and rotate with the engagement parts 162b between the lock position and the unlock position. The tab 162c is engaged with the engagement part 162b when the handle 162a is located at the lock position shown in FIG. 6, and fixes the BP movable shelf 160 to the housing 110. In the lock state, the BP movable shelf 160 pressurizes the housing 110 due to the taper action of the engagement part 162b. The tab 162c is disengaged from the engagement part 162b when the handle 162a is located at the unlock position, enables the BP movable shelf 160 to move relative to the housing 110. The fixing part 162d fixes the tab 162c onto the housing 110.

The moving mechanism (first moving unit) 164 of this embodiment is a caster provided on the bottom surface 161b of the frame 161, as shown in FIG. 3, but may apply any structures known in the art, similar to the moving mechanism 130. The moving mechanism 164 moves the frame 161 relative to the units 210 to 240 and the housing 110.

The positioning mechanism 168 positions the frame 161 relative to the housing 110. The positioning mechanism 168 has, as shown in FIG. 3, a pair of positioning pins 168a fixed onto the upper part of the rear surface 161c of the frame 161, and a pair of engagement holes 168b that are formed in the housing 110 as shown in FIG. 7 and engageable with the positioning pins 168a. FIG. 7 shows that the engagement holes 168b are engaged with the positioning pins 168a.

Figure 8:
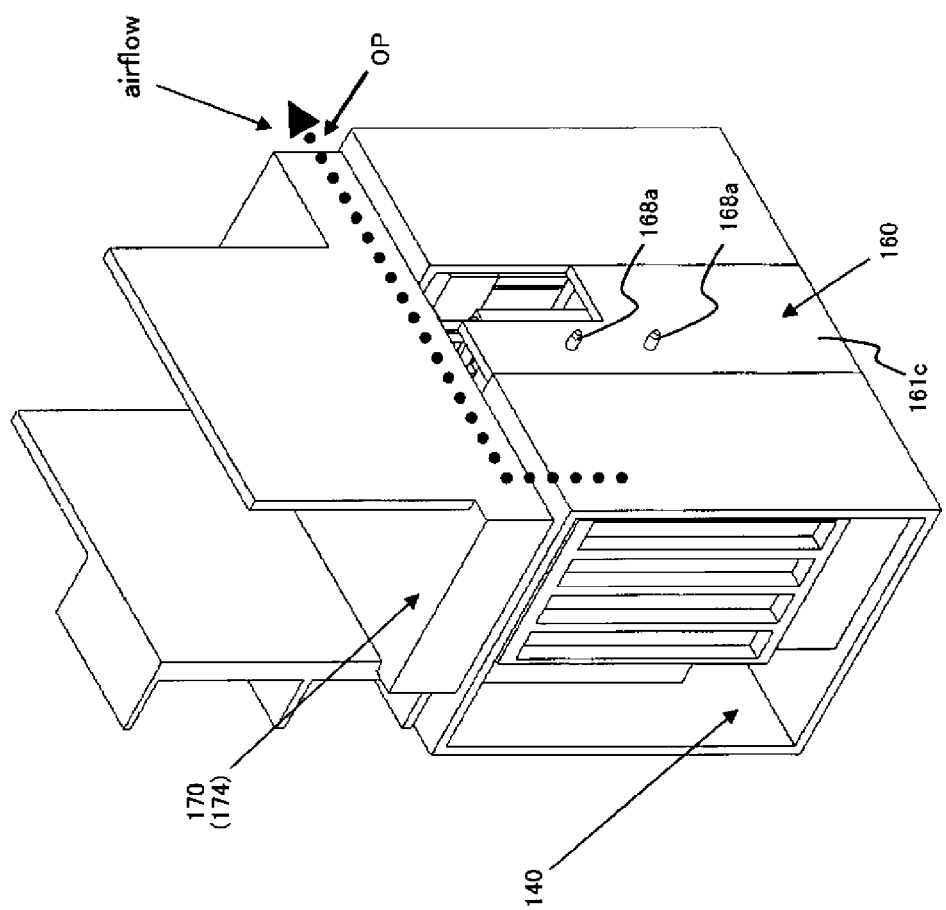
FIG. 8 is a front perspective view for explaining an exhaust structure of the server shown in FIG. 1A.

The housing 110 has an intake port IP that absorbs air to cool various units mounted on its bottom surface, and an exhaust port OP near its upper end from which the air that has cooled the various units is exhausted. The exhaustion mechanism 170 secures an air passage from the intake port IP to the exhaust port OP. FIG. 8 shows the air passage used to cool various units by a broken line. The exhaustion mechanism 170 of this embodiment has, as shown in FIG. 9B, an exhaust flow control plate 172 and an exhaust duct 174.

FIG. 9A shows passages in a conventional server 10 by broken lines. The passage pass the power unit 22 from intake ports IP to an exhaust duct 24 via a fan unit 14 and a CPU unit 12. The passage from the intake ports IP is led to the exhaust duct 24 via an IO unit 18 and a fan unit 16. The exhaust air introduced to the exhaust duct 24 is exhausted through the exhaust port OP to the outside of the server 10.

In the conventional server 10, as shown in FIG. 9A, units 12 and 14 are fixed on the right side of the BP unit 20 (or in the anterior of the server 10), and units 16 and 18 are fixed on the left side of the BP unit 20 (or in the posterior of the server 10) in the housing 11 of the server 10. Therefore, the passage does not change and stably maintains the airflow in it, and the server 10 can maintain the predetermined heat radiation efficiency. In FIG. 9A, the exhaust duct 24 extends to the top of the CPU unit 12 on the rear surface of the power unit 22.

On the other hand, in the server 100 shown in FIG. 9B, the anterior movable shelf 120, the posterior movable shelf 140, and the BP movable shelf 160 can move, and the moving spaces should be secured for these shelves for their easy movements. In these spaces, the air leaks and the exhaust turbulence can occur, lowering the heat radiation efficiency. FIG. 9B corresponds to a sectional view of the rear surface of the server 100 shown in FIG. 1 when it is viewed from the side of the posterior movable shelf 140.

The exhaustion mechanism 170 has an exhaust flow control plate 172 having a labyrinth structure. The exhaust flow control plate 172 serves to introduce the exhaust air to the exhaust duct 174, and prevents the exhaust air from leaking in a direction X shown by an alternate long and short dash line. The exhaust flow control plate 172 is located between the posterior movable shelf 140 and the exhaust duct 174, and fixed onto the housing 110. This is a conventionally vacant space and may leak the air, but the exhaust flow control plate 172 restricts the air leakage and secures the passage. FIG. 8 shows an exhaust duct 174 arranged on each movable shelf. The exhaust duct 174 is a hollow, approximately rectangular parallelepiped member that extends in the direction perpendicular to the paper plane of FIG. 9B (horizontal direction of the server 10), and forms a passage. The bottom surface and the rear surface shown in FIG. 8 are open, and the rear surface is connected to the exhaust port OP. The exhaust air flows in the exhaust duct 174 via an opening in the bottom surface, and is exhausted from the exhaust port OP via the opening part of the rear surface.

A description will now be given of a test in the housing 110 and an exchange of each unit in the server 100.

In the test, as shown in FIG. 4, the connector part 236 of the BP 230 is connected to the test 290 via the cables 238, and the operation checking test is performed. The cables 238 and the connector 236 can be connected to each other when the BP movable shelf 160 is pulled out, and the workability improves since it is unnecessary to disassemble the housing 110, unlike the conventional configuration. Then, in the test of the BP 230 itself, such as a Net test and an open short test, a dummy board may be mounted as a unit on the anterior or posterior movable shelf. In the test of the entire server 100, each unit is mounted on each movable shelf and tested. When the operation checking test result is successful, the server 100 is shipped. When the operation checking test result is unsuccessful, a failed component is exchanged and the operation checking test is repeated. When the BP 230 is found to fail, the BP 230 is exchanged. A description will now be given of an exchange or maintenance of the BP 230.

Figure 5:
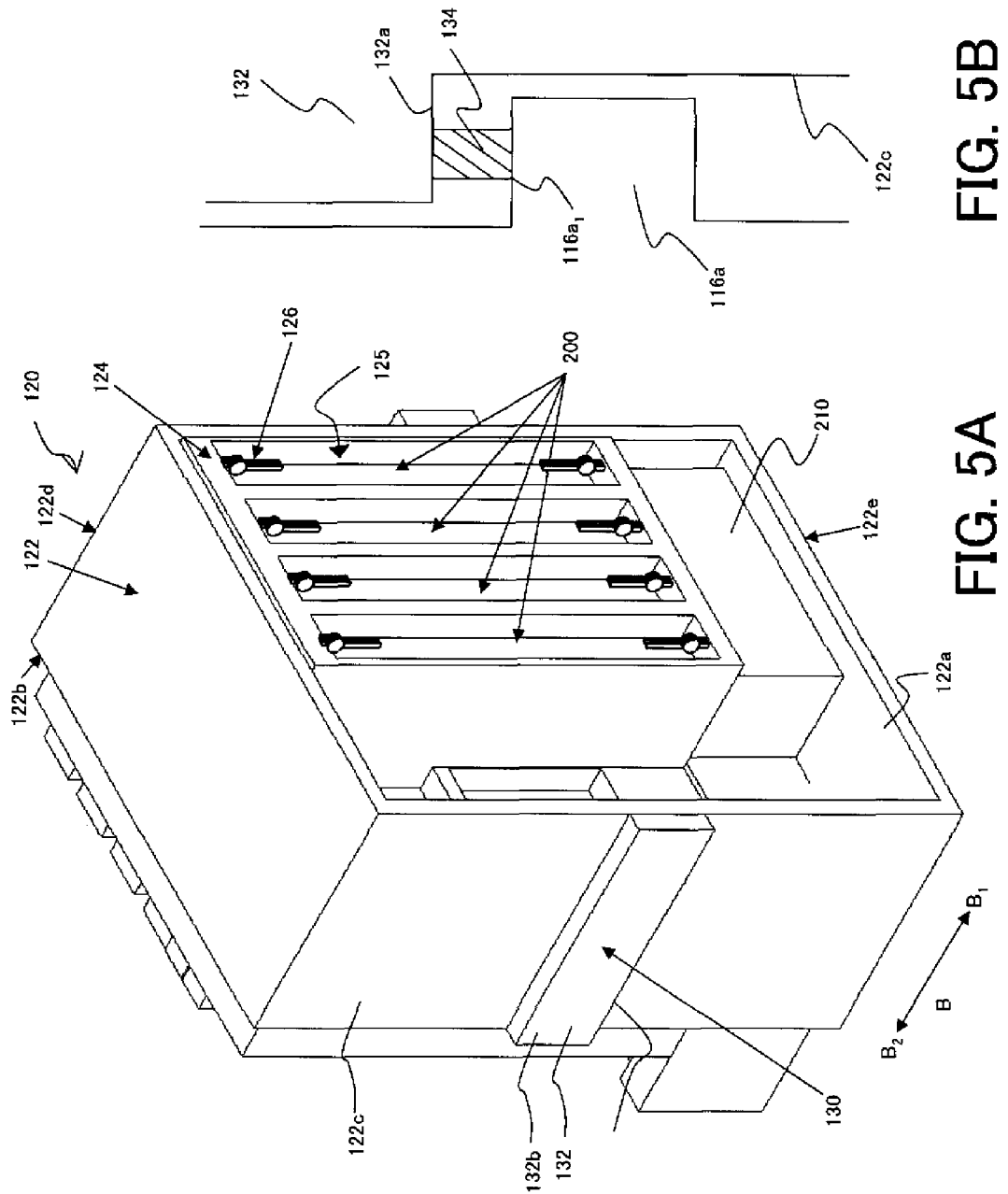
FIG. 5A is an enlarged perspective view of an anterior movable shelf of the server shown in FIGS. 1A and 1B.
FIG. 5B is a schematic sectional view showing a connection between the moving mechanism shown in FIG. 5A and the housing of the server shown in FIG. 1A.

Initially, in the state shown in FIG. 1A, the pressurizing mechanisms (not shown) are released in the anterior movable shelf 120 and the posterior movable shelf 140. Next, the levers 126 shown in FIG. 5 are released for all the units mounted on the anterior movable shelf 120 and the posterior movable shelf 140. Next, all the CPU units 200 are slightly moved from the inner side frame 124 in the $B_1$ direction, and all the IO units 220 are slightly moved from the inner side frame 144 in the $B_2$ direction.

Next, the handles 162a of the pressurizing mechanism 162 on the BP movable shelf 160 are moved and unlocked. Next, the metal fitting 244 is taken out by unscrewing through the opening $161a_1$ in the BP movable shelf 160. Next, the anterior movable shelf 120 is moved in the $B_1$ direction, and the interlock mechanism is unlocked. Similarly, the posterior movable shelf 140 is moved in the $B_2$ direction, and the interlock mechanism is unlocked. Next, all the cables 238 are detached from the connector part 236. On each of the shelves 120 and 140, the outer frames 122 and 142 and the inner frames 124 and 144 are unscrewed, and each unit can be simultaneously pulled out. Therefore, the workability improves.

Next, as shown in FIG. 1B, the BP movable shelf 160 is pulled out in the $A_1$ direction. Thereafter, the BP 230 is detached from the BP movable shelf 160, and a new BP 230 is attached to the BP movable shelf 160. The conventional server 10 requires all the units to be detached from the BP 20, and the inner shelf to be then detached. Then, a workman needs to creep into the housing 11, and detach the BP 20. However, this embodiment enables the BP 230 to be easily pulled out of the housing 110 and exchanged, and improves the exchanging workability, unlike the conventional server 10 that requires disassemblies.

The procedure to accommodate the BP movable shelf 160 in the housing 110 is in inverse relation to the above procedure. In other words, the BP movable shelf 160 is inserted in the $A_2$ direction to some extent, and the cables 238 are attached to the connector part 236. Next, the BP movable shelf 160 is positioned to the housing 110 by using the positioning mechanism 168. Next, the handles 162a of the pressurizing mechanism 162 of the BP movable shelf 160 are moved to the lock position and to set the lock state.

Next, the anterior movable shelf 120 and the posterior movable shelf 140 are engaged with and locked to the BP movable shelf 160 via the positioning mechanism 135 and the interlock mechanism 137. Next, these units are engaged with the BP 230 for electric connections.

Next, the levers 126 of the anterior movable shelf 120 and the posterior movable shelf 140 are moved to turn the unlock state to the lock state. Finally, the handles of the pressurizing mechanism of the anterior movable shelf 120 and the posterior movable shelf 140 are moved to the lock position to set the lock state.

Since the present invention provides positioning between shelves before each unit is engaged with the BP 230, each unit can be stably connected to the BP 230. In addition, the interlock mechanism allows the normal procedure to achieve the pulling operation, and prevents damages of each unit, in particular, the connection part.

From the viewpoint of the size and weight of each unit and the inner frame, a movement mechanism may be directly attached to each inner frame, and each unit may be independently pulled out.

In addition, this embodiment exchanges the BP 230 within a time period that is about quarter the conventional operating time period, and remarkably improves the workability. This embodiment discusses the exchange of the BP 230, but even in exchanging each unit, pulling out of the inner frame 124 and 144 are easy and the workability improves.

Further, the present invention is not limited to these preferred embodiments, and various modifications and variations may be made without departing from the spirit and scope of the present invention. In addition, the electronic apparatus of this embodiment is a server, but the present invention is applicable to a central computer in the base station and server tester.

What is claimed is:

1. An electronic apparatus comprising:
   a housing;
   a first unit that is attached through a front side of said housing;
   a second unit that is attached through a backside of said housing;
   a panel that has a first surface connected to said first unit, and a second surface connected to said second unit, and establishes an electric connection between said first unit and said second unit; and
   a support member to which said panel is attached, said support member being movable relative to said housing in a side surface direction of said housing.

2. An electronic apparatus comprising:
   a back panel that is engaged with and electrically connected to plural units, and serves as an interface for the plural units;
   a housing that accommodates the plural units and said back panel;
   a first support member that supports said back panel; and
   a self-propelled first moving unit that moves said first support member relative to said housing and the plural units.

3. An electronic apparatus according to claim 2, further comprising a positioning mechanism that positions said first support member relative to the housing.

4. An electronic apparatus according to claim 2, wherein the plural units include a power unit, and a power bar connected to the power unit, said first support member is connected to the power bar, and a connection part between said first support member and the power bar exposes outside said housing.

5. An electronic apparatus according to claim 2, wherein the plural units include a heat-radiating fan unit, and said back panel has connection parts between an external apparatus and the fan unit, and the connection parts can expose outside said housing.

6. An electronic apparatus according to claim 2, further comprising:
   a second support member that supports the plural units; and
   a self-propelled second moving unit that moves said second support member relative to said housing and said back panel.

7. An electronic apparatus according to claim 6, further comprising a positioning mechanism that positions the second support member relative to the first support member.

8. An electronic apparatus according to claim 6, further comprising an interlock mechanism that fixes the first support member onto the second support member while the plural units are engaged with said back panel.

9. An electronic apparatus according to claim 2, wherein the plural units include a heat-radiating fan unit, the electronic apparatus further comprising an exhaust flow control plate that is fixed in said housing, and defines an exhaust channel from the fan unit.

* * * * *